United States Patent
Reith et al.

(10) Patent No.: US 12,057,539 B2
(45) Date of Patent: Aug. 6, 2024

(54) OPTOELECTRONIC COMPONENT AND THE CONNECTIVITY THEREOF

(71) Applicant: OSRAM OLED GmbH, Regensburg (DE)

(72) Inventors: Andreas Reith, Steinach (DE); Paola Altieri-Weimar, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 17/055,040

(22) PCT Filed: Apr. 2, 2019

(86) PCT No.: PCT/EP2019/058289
§ 371 (c)(1),
(2) Date: Nov. 12, 2020

(87) PCT Pub. No.: WO2019/219287
PCT Pub. Date: Nov. 21, 2019

(65) Prior Publication Data
US 2021/0217940 A1    Jul. 15, 2021

(30) Foreign Application Priority Data
May 16, 2018   (DE) ................ 10 2018 111 791.4

(51) Int. Cl.
*H01L 27/15* (2006.01)
*H01L 25/16* (2023.01)
(Continued)

(52) U.S. Cl.
CPC ........... *H01L 33/62* (2013.01); *H01L 25/167* (2013.01); *H01L 33/486* (2013.01)

(58) Field of Classification Search
CPC ..... H01L 33/62; H01L 25/167; H01L 33/486; H01L 33/642
See application file for complete search history.

(56) References Cited

U.S. PATENT DOCUMENTS 5,923,084 A * 7/1999 Inoue .................. H01L 23/3121
257/E23.125
8,378,378 B2 * 2/2013 Lin ......................... H01L 33/62
438/26
(Continued)

FOREIGN PATENT DOCUMENTS

CN         1925182 A    3/2007
CN       102057506 A    5/2011
(Continued)

OTHER PUBLICATIONS

International Search Report for International Patent Application No. PCT/EP2019/058289, mailed May 29, 2019 (5 pages).
(Continued)

*Primary Examiner* — Ismail A Muse
(74) *Attorney, Agent, or Firm* — ARENTFOX SCHIFF LLP

(57) ABSTRACT

The invention relates to an optoelectronic component having: a carrier; an optoelectronic semiconductor chip; an insulation layer, which has an electrically insulating material; and a first contact layer, which has an electrically conductive material. According to the invention, the insulation layer is arranged on the carrier and has a cavity; the semiconductor chip is arranged in the cavity; the first contact layer is arranged between the semiconductor chip and the carrier and between the insulation layer and the carrier; and the first contact layer has at least one interruption, such that the carrier is free of the first contact layer at least in some parts in the region of the cavity.

13 Claims, 8 Drawing Sheets

(51) Int. Cl.
*H01L 29/26* (2006.01)
*H01L 31/12* (2006.01)
*H01L 33/00* (2010.01)
*H01L 33/48* (2010.01)
*H01L 33/62* (2010.01)

(56) References Cited

U.S. PATENT DOCUMENTS

| | | | |
|---|---|---|---|
| 2006/0118804 A1* | 6/2006 | Nagai | H01L 33/486 257/E33.072 |
| 2006/0147746 A1* | 7/2006 | Wakako | H05K 3/246 428/673 |
| 2006/0198162 A1* | 9/2006 | Ishidu | H01L 33/60 257/E33.072 |
| 2007/0057364 A1 | 3/2007 | Wang et al. | |
| 2007/0085101 A1 | 4/2007 | Kim | |
| 2008/0023713 A1* | 1/2008 | Maeda | H01L 33/486 257/E33.072 |
| 2008/0043444 A1* | 2/2008 | Hasegawa | H01L 33/642 361/717 |
| 2008/0296599 A1 | 12/2008 | Mazzochette | |
| 2009/0001404 A1* | 1/2009 | Ohata | H01L 33/647 438/26 |
| 2009/0278162 A1* | 11/2009 | Wang | C04B 35/10 257/E33.057 |
| 2011/0031509 A1* | 2/2011 | Kirihara | H01L 24/97 257/E31.099 |
| 2011/0254039 A1* | 10/2011 | Kim | H01L 24/97 257/98 |
| 2012/0175643 A1* | 7/2012 | West | H01L 33/62 438/26 |
| 2013/0092421 A1* | 4/2013 | Kajiya | H05K 1/0201 174/252 |
| 2014/0011309 A1 | 1/2014 | Lechleiter et al. | |
| 2014/0036461 A1* | 2/2014 | Palaniswamy | H05K 1/021 174/254 |
| 2014/0145235 A1* | 5/2014 | Shum | H01L 33/64 257/98 |
| 2015/0048408 A1* | 2/2015 | Nam | H01L 33/62 438/26 |
| 2015/0295141 A1 | 10/2015 | Schwarz et al. | |
| 2018/0040773 A1* | 2/2018 | Fukuda | H01L 33/46 |

FOREIGN PATENT DOCUMENTS

| | | |
|---|---|---|
| CN | 107482099 A | 12/2017 |
| EP | 3255686 A1 | 12/2017 |
| JP | H11340515 A | 12/1999 |
| JP | 2006013144 A | 1/2006 |

OTHER PUBLICATIONS

Office Action in JP2020564081, mailed Feb. 21, 2023, 8 pages.
First Office Action in Chinese Patent Application No. 201980032433.6, mailed Mar. 30, 2024 (7 pages).

* cited by examiner

OPTOELECTRONIC COMPONENT AND THE CONNECTIVITY THEREOF

This application is a 35 U.S.C. § 371 National Phase of PCT Application No. PCT/EP2019/058289, filed Apr. 2, 2019, which claims priority to German Patent Application No. 102018111791.4, filed May 16, 2018, the disclosures of each of which are hereby incorporated by reference herein in their entireties.

An optoelectronic component is specified.

One task to be solved is to specify an optoelectronic component that can be operated efficiently.

According to at least one embodiment of the optoelectronic component, the optoelectronic component comprises a carrier. The carrier can be, for example, a terminal carrier, a printed circuit board, a printed circuit board or a metal core board. The carrier can be a three-dimensional body and can have the shape of a cylinder, a disk or a cuboid, for example. In particular, the carrier has a main extension plane. For example, the main extension plane of the carrier is parallel to a surface, for example a cover surface, of the carrier. The carrier may have an electrically insulating material such as a dielectric material. The optoelectronic component may also have a main extension plane which is parallel to the main extension plane of the carrier.

According to at least one embodiment of the optoelectronic component, the optoelectronic component comprises an optoelectronic semiconductor chip. The semiconductor chip may be configured to emit or detect electromagnetic radiation, especially light, during operation. The semiconductor chip is, for example, a luminescent diode chip such as a light emitting diode chip or a laser diode chip. Alternatively, the semiconductor chip can be configured to detect electromagnetic radiation, especially light. For example, the semiconductor chip is then a photodiode.

According to at least one embodiment of the optoelectronic component, the optoelectronic component comprises an insulating layer comprising an electrically insulating material. For example, the insulating layer may comprise a dielectric material. For example, the insulating layer may have a material formed with an epoxy resin. For example, the insulating layer may have the material FR4 or consist of it.

According to at least one embodiment of the optoelectronic component, the optoelectronic component comprises a first contact layer which comprises an electrically conductive material. The first contact layer may be or is a metal, such as for example copper. The first contact layer extends at least in sections parallel to the main extension plane of the carrier.

According to at least one embodiment of the optoelectronic component, the insulating layer is arranged on the carrier and has a cavity. The insulating layer can be bonded to the carrier, for example by a soldering process. Between the insulating layer and the carrier a bonding material may be arranged. Alternatively, the insulating layer is in direct contact with the carrier. The carrier is then coated with the material of the insulating layer, for example, wherein the material is cured after it is applied to the carrier. The insulating layer can be flush with the carrier at side edges of the optoelectronic component so that the insulating layer does not protrude beyond the carrier in lateral directions, wherein the lateral directions being parallel to the main extension plane of the carrier. The cavity can be arranged in such a way that it is completely surrounded in lateral directions by the insulating layer and, if necessary, the connecting material. The cavity then forms a recess in the insulating layer.

According to at least one embodiment of the optoelectronic component, the semiconductor chip is arranged in the cavity.

The semiconductor chip can be arranged in the cavity in such a way that it is completely surrounded by the insulating layer in lateral directions. In addition, the semiconductor chip is arranged directly or indirectly on the carrier. The semiconductor chip can be connected to the carrier by a connecting material. This means that the connecting material is arranged between the semiconductor chip and the carrier. Furthermore, another component of the component—such as for example a contact layer—can be arranged between the carrier and the semiconductor chip. After the semiconductor chip has been placed in the cavity, the cavity can be filled. For example, the cavity is filled with a transparent material that is permeable to the electromagnetic radiation emitted or detected by the semiconductor chip.

According to at least one embodiment of the optoelectronic component, the first contact layer is located between the semiconductor chip and the carrier and between the insulating layer and the carrier. This may mean that the first contact layer is arranged at least in places between the semiconductor chip and the carrier and at least in places between the insulating layer and the carrier. The first contact layer is arranged in particular in the vertical direction between the semiconductor chip and the carrier and between the insulating layer and the carrier, wherein the vertical direction being perpendicular to the main extension plane of the carrier. Between the semiconductor chip and the first contact layer, a connecting material such as for example an adhesive, in particular an electrically conductive one, or a solder material may be arranged. The first contact layer may be located on the carrier. The semiconductor chip is electrically conductively connected to the first contact layer.

According to at least one embodiment of the optoelectronic component, the first contact layer has at least one interruption, so that the carrier in the region of the cavity is free of the first contact layer at least in places. The first contact layer thus does not completely cover the carrier. The first contact layer can have at least two partial areas, whereby the interruption is located between the partial areas and the partial areas are not in direct contact at least in places. The partial areas can be arranged at a distance from each other. A bottom surface of the cavity facing the carrier is not completely covered by the first contact layer. This can mean that the carrier has a relaxation area in the area of the cavity which is free of the first contact layer and the semiconductor chip. This relaxation area can partially or preferably completely surround the semiconductor chip in lateral directions like a frame. The interruption can have a size of at least 50 μm in the lateral direction. The interruption can have a size of at most 200 μm or 500 μm in the lateral direction.

For example, the first contact layer may cover less than 90% of the lateral extent of the carrier. This may mean that the first contact layer extends over an area which is at most 90% of the size of the surface of the carrier facing the semiconductor chip.

According to at least one embodiment of the optoelectronic component, the optoelectronic component comprises a carrier, an optoelectronic semiconductor chip, an insulating layer comprising an electrically insulating material, and a first contact layer comprising an electrically conductive material, wherein the insulating layer being disposed on the carrier and having a cavity, the semiconductor chip is arranged in the cavity, the first contact layer is arranged between the semiconductor chip and the carrier and between the insulating layer and the carrier, and the first contact layer has at least one interruption, so that the carrier is free of the first contact layer at least in places in the region of the cavity.

The optoelectronic component described here is based, among other things, the idea of reducing or avoiding thermo-mechanical stresses occurring in the component. Due to the different coefficients of thermal expansion of the materials of the component, different components of the component deform to different degrees when exposed to temperature changes. Temperature changes can occur during the soldering process and/or during operation of the component, for example. This can lead to thermo-mechanical stresses within the component. In addition, the component can bend due to the stresses. This can reduce the quality of the connection between the semiconductor chip and the carrier and/or the insulating layer and the carrier. It is also possible that the connection between individual components of the component is damaged and that individual components become detached from each other. Thus the component may have a lower stability against temperature changes or the temperature cycle stability may be reduced.

It has been shown that if the carrier in the area of the cavity is free of the first contact layer at least in places, stresses in the component in the area of the cavity can be relieved or reduced. For example, the carrier has a dielectric material through which thermo-mechanical stresses can be at least partially relieved. These stresses can occur, for example, due to different thermal expansion coefficients of the materials used in the optoelectronic component when the temperature changes.

It has now been shown that the thermo-mechanical stresses in the area of at least one interruption of the first contact layer—i.e. especially due to the relaxation area—are relieved. Thus, less thermo-mechanical stresses are transferred to other areas of the optoelectronic component. In addition, due to the interruption, bending of the component in the area of the semiconductor chip is reduced or avoided. Thus, the component is more stable against temperature changes and the stability of the connection between the semiconductor chip and the carrier is improved. The probability of a faulty connection between the semiconductor chip and the carrier is thus reduced. Overall, the lifetime of the component is therefore extended and the component can be operated more efficiently.

If the relaxation region surrounds the semiconductor chip completely in the lateral directions, the semiconductor chip is thermo-mechanically decoupled from other regions of the optoelectronic component and mechanical stresses can be reduced via the relaxation region.

Furthermore, it is not necessary to use materials with adapted or similar thermal expansion coefficients for the carrier, the insulating layer and the first contact layer. Since thermo-mechanical stresses can be relieved via the carrier, a variety of materials can be used for the component. In addition, cost-effective materials can be used.

According to at least one embodiment of the optoelectronic component, the cavity extends completely through the insulating layer from a top side facing away from the carrier to the carrier. The insulating layer has a top side facing away from the carrier. The cavity can be formed from the top side of the insulating layer. The bottom surface of the cavity facing the carrier can be formed at least in places by a surface of the carrier. The cavity has side walls which are transverse or perpendicular to the main extension plane of the carrier. The side walls of the cavity may extend from the top side of the insulating layer to the carrier. Since the cavity extends completely through the insulating layer, the space in which the optoelectronic semiconductor chip is located is maximized. The optoelectronic semiconductor chip can thus have a height in the vertical direction which is approximately equal to the thickness of the insulating layer in the vertical direction.

According to at least one embodiment of the optoelectronic component, the semiconductor chip and the insulating layer are arranged contact-free to each other. This means that the semiconductor chip and the insulating layer are spaced apart from each other. The semiconductor chip and the insulating layer are thus not in direct contact with each other. The semiconductor chip can be arranged in the cavity in such a way that it is spaced apart from the side walls of the cavity. A filling material can be arranged between the semiconductor chip and the insulating layer.

According to at least one embodiment of the optoelectronic component, a second contact layer, which has an electrically conductive material, is arranged at least in places on an underside of the carrier facing away from the insulating layer and has at least one interruption, so that the carrier is free of the second contact layer at least in places in the region of the cavity. The second contact layer can be a layer which extends in places on the underside of the carrier. This means in particular that the second contact layer has areas which are spaced apart from each other. The second contact layer can have further areas which are not in direct contact with each other. Between the areas of the second contact layer there may be at least one interruption.

The carrier is therefore not completely covered with the second contact layer. This can mean that the carrier has a relaxation area in the area of the cavity which is free from the first contact layer, the second contact layer and the semiconductor chip. The interruption of the second contact layer can have a size of at least 50 µm in lateral direction. The interruption of the second contact layer can have a size of at most 500 µm in lateral direction, in particular of at most 200 µm.

The second contact layer has the electrical connections on the underside of the carrier. For example, the second contact layer covers less than 90% of the lateral extent of the carrier. This may mean that the second contact layer extends over an area that is no more than 90% of the size of the surface of the carrier facing away from the semiconductor chip. For example, the second contact layer is copper. At least a portion of the second contact layer may be connected to the first contact layer. For example, at least a portion of the second contact layer is thermally connected to the first contact layer. Thus, heat from the semiconductor chip can be dissipated advantageously via the first contact layer and the second contact layer.

According to at least one embodiment of the optoelectronic component, the first contact layer is electrically conductively connected to the second contact layer. In particular, the first contact layer is connected to the second contact layer via electrically conductive vias. The vias can extend from the first contact layer through the carrier to the second contact layer. The first contact layer may be electrically conductively connected to a portion of the second contact layer. Such an electrically conductive connection between the first contact layer and the second contact layer enables heat to be dissipated from the semiconductor chip to the second contact layer in addition to the electrical connection.

It is therefore advantageous to dissipate heat from the semiconductor chip during operation of the optoelectronic component.

According to at least one embodiment of the optoelectronic component, a third contact layer, which has an electrically conductive material, is arranged at least in places on a top side of the insulating layer facing away from the carrier. The third contact layer may comprise a metal, for example as copper, or be formed with it. The third contact layer extends at least in places parallel to the main extension plane of the carrier. The third contact layer may be applied to the insulating layer. The third contact layer may have at least one interruption. This means that the top side of the insulating layer can be free of the third contact layer at least in places. The third contact layer can have at least two areas which are spaced apart from each other. The at least two areas of the third contact layer can be electrical connections. For example, the semiconductor chip is electrically connected to at least two electrical connections.

According to at least one embodiment of the optoelectronic component, the third contact layer completely covers the top side of the insulating layer. Thus the third contact layer extends over the entire lateral extent of the insulating layer. It has been shown that with a third contact layer which completely covers the top side of the insulating layer, the bending of the optoelectronic component in the area of the insulating layer is reduced with temperature changes. The third contact layer, which can be arranged around the semiconductor chip like a frame, for example completely in the lateral directions, can counteract the bending of the component resulting from the different thermal expansion of the first contact layer, the second contact layer and the carrier in the area of the insulating layer.

According to at least one embodiment of the optoelectronic component, the optoelectronic semiconductor chip has electrical contacts on a side facing away from the carrier. For example, the optoelectronic semiconductor chip has two electrical contacts. The electrical contacts of the semiconductor chip are spaced apart from each other. Thus, for example, a p-doped area and an n-doped area of the semiconductor chip can be electrically contacted.

According to at least one embodiment of the optoelectronic component, the electrical contacts of the optoelectronic semiconductor chip are electrically conductively connected to electrical connections on a underside of the carrier facing away from the insulating layer. The electrical contacts of the semiconductor chip may be electrically connected to areas of the third contact layer. For example, the electrical contacts of the semiconductor chip are connected to areas of the third contact layer with bonding wires. It is also possible that the electrical contacts are electrically conductively connected to partial areas of the second contact layer, whereby the partial areas serve as electrical connections of the optoelectronic component.

The partial areas of the second contact layer, which serve as electrical connections on the underside of the carrier, can be electrically conductively connected to the third contact layer or at least to areas of the third contact layer. For this purpose, vias can extend through the insulating layer and the carrier from the third contact layer to the second contact layer. The vias may be made of an electrically conductive material. Via the vias, areas of the third contact layer can be electrically connected to partial areas of the second contact layer on the underside of the carrier, which serve as electrical connections of the optoelectronic component. Therefore, the optoelectronic component can advantageously be surface mounted.

According to at least one embodiment of the optoelectronic component, the optoelectronic component is surface mountable. This means in particular that the semiconductor chip can be electrically contacted via electrical connections on the underside of the carrier. This allows an uncomplicated use and mounting of the optoelectronic component.

According to at least one embodiment of the optoelectronic component, the optoelectronic component is free of an electrically conductive layer extending over the entire extent of the optoelectronic component in a lateral direction, the lateral direction being parallel to a main extension plane of the optoelectronic component.

This means that the first and second contact layers do not extend in a lateral direction over the entire extent of the optoelectronic component, since the first and second contact layers have at least one interruption.

The third contact layer also does not extend in a lateral direction over the entire extent of the optoelectronic component, since the top side of the insulating layer does not extend over the entire extent of the optoelectronic component. The third contact layer is not located in the area of the cavity.

The interruptions in the contact layers enable the reduction of thermo-mechanical stresses over, for example, the carrier. This can reduce or prevent bending of the optoelectronic component in the area of the semiconductor chip.

According to at least one embodiment of the optoelectronic component, the optoelectronic semiconductor chip is protruded above the insulating layer in a vertical direction or is flush with it, wherein the vertical direction being perpendicular to a main extension plane of the optoelectronic component. This may mean that the insulating layer extends further in the vertical direction than the optoelectronic semiconductor chip. Alternatively, it is possible that the insulating layer and the optoelectronic semiconductor chip extend equally far in the vertical direction. The insulating layer can advantageously protrude over the semiconductor chip in the vertical direction to protect it mechanically. This is particularly advantageous if the semiconductor chip is electrically contacted with bonding wires on a side facing away from the carrier.

According to at least one embodiment of the optoelectronic component, a third contact layer, which comprises an electrically conductive material, is arranged at least in places on a top side of the insulating layer facing away from the carrier, and the third contact layer completely covers the top side of the insulating layer, wherein the optoelectronic component being free of an electrically conductive layer which extends over the entire extent of the optoelectronic component in a lateral direction, wherein the lateral direction being parallel to a main extension plane of the optoelectronic component. It has been shown that a third contact layer, which completely covers the top side of the insulating layer, counteracts bending of the optoelectronic component in the region of the insulating layer. In addition, bending of the optoelectronic component in the area of the cavity is prevented or reduced by not extending any of the electrically conductive layers of the component over the entire extent of the component. Thermo-mechanical stresses can be reduced, for example, by interruptions in the first and second contact layer.

In the following, the optoelectronic component described here is explained in more detail in conjunction with exemplary embodiments and the corresponding figures.

FIGS. 6A, 6B, 7A, 7B, 8A, 8B, 9A, 9B, 10A and 10B show the relative displacement of the surface perpendicular to the surface of an optoelectronic component according to different exemplary embodiments for different temperatures. The displacement is evaluated relative to a temperature of 25° C. and is based in FIGS. 6A to 8B on finite element computer simulations and in FIGS. 9A to 10B on optical measurements.

Identical, similar or equivalent elements are marked with the same reference signs in the figures. The figures and the proportions of the elements represented in the figures to each other are not to be considered as true to scale. Rather, individual elements may be oversized for better representability and/or comprehensibility.

Figure 1A:
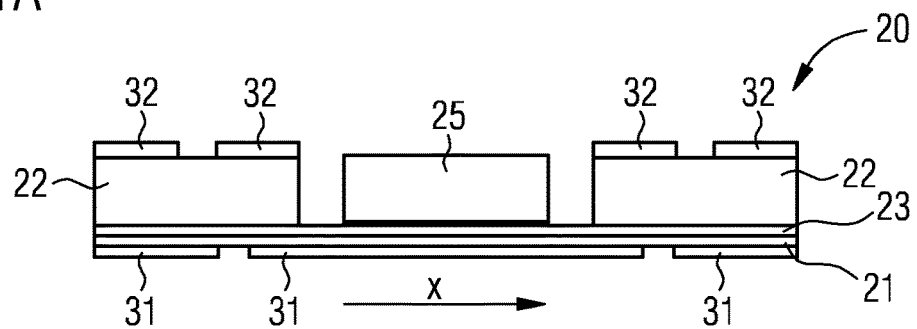
FIGS. 1A and 1B show schematic cross-sections through an optoelectronic component.

In FIG. 1A a schematic cross-section of an optoelectronic component 20 is shown, which is not an exemplary embodiment. The optoelectronic component 20 has a carrier 21, an insulating layer 22, a optoelectronic semiconductor chip 25, a first contact layer 23, a second contact layer 31 and a third contact layer 32. The first contact layer 23 is located between the semiconductor chip 25 and the carrier 21 and between the insulating layer 22 and the carrier 21. The first contact layer 23 extends in a lateral direction x over the entire extension of the optoelectronic component 20, wherein the lateral direction x being parallel to the main extension plane of the optoelectronic component 20. The second contact layer 31 covers an underside of the carrier 21 in places and the third contact layer 32 covers a top side of the insulating layer 22 in places. Due to the different thermal expansion coefficients of the insulating layer 22, the first, second and third contact layers 23, 31, 32 and the carrier 21, thermo-mechanical stresses may occur in the optoelectronic component 20 when the temperature changes, resulting in bending of the component 20, as shown schematically in FIG. 1B.

Figure 1B:
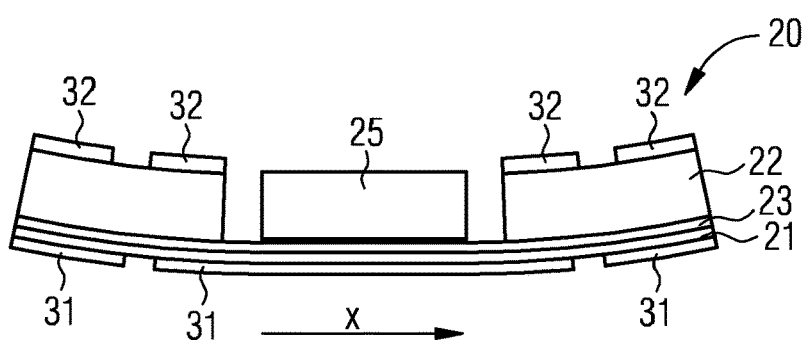

In FIG. 1B a schematic cross-section of an optoelectronic component 20 as shown in FIG. 1A is shown. It is shown that the mechanical stresses that can occur with temperature changes can lead to bending of the optoelectronic component 20. Bending of the optoelectronic component 20 can occur in the area of the semiconductor chip 25 and in the area of the insulating layer 22.

Figure 2:
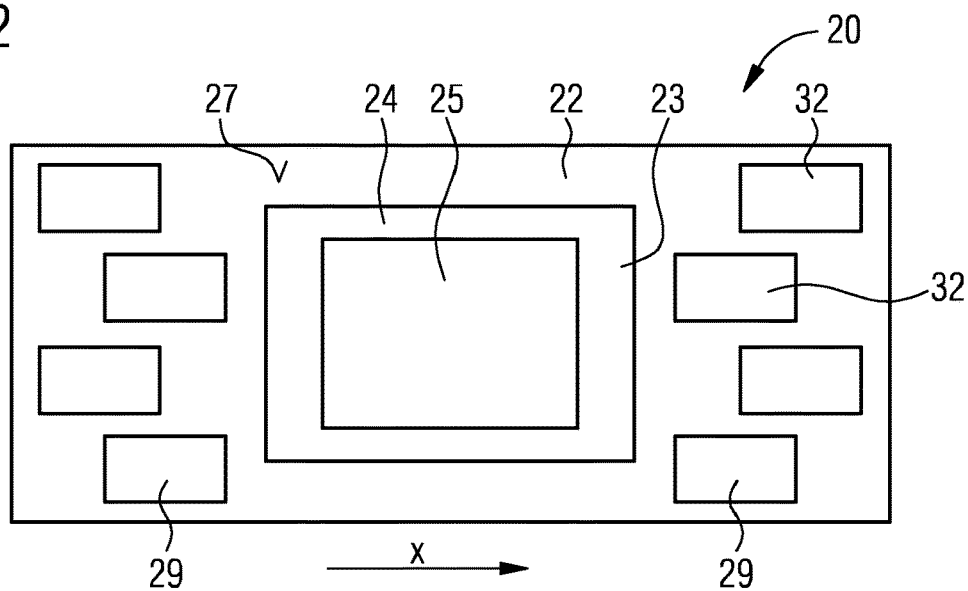
FIG. 2 shows a schematic top view of an optoelectronic component.

In FIG. 2 a top view of an optoelectronic component 20, which is not an exemplary embodiment, is shown. The optoelectronic component 20 has an insulating layer 22, which is an electrically insulating material. Furthermore, the insulating layer 22 has a cavity 24. An optoelectronic semiconductor chip 25 is arranged in the cavity 24. On a top side 27 of the insulating layer 22, a third contact layer 32 is arranged, which has an electrically conductive material. The third contact layer 32 covers the insulating layer 22 on the top side 27 in places. The third contact layer 32 thus has several areas which are spaced apart from each other. These areas can be electrical connections 29. The semiconductor chip 25 and the insulating layer 22 are arranged contact-free to each other. The insulating layer 22 completely surrounds the semiconductor chip 25 in lateral directions x, wherein the lateral directions x are parallel to the main extension plane of the optoelectronic component 20. The first contact layer 23 extends over the entire cavity 24 and beyond over the entire surface of the optoelectronic component 20.

Figure 3A:
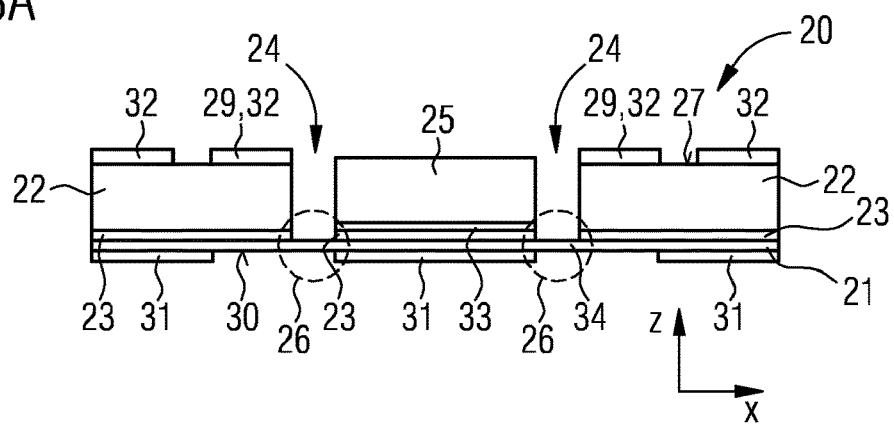
FIGS. 3A, 3B, 4A, 4B and 5 show schematic cross-sections through an optoelectronic component according to various exemplary embodiments.

In FIG. 3A a schematic cross-section of the optoelectronic component 20 according to an exemplary embodiment is shown. The optoelectronic component 20 has a carrier 21. The insulating layer 22 is arranged on the carrier 21. The carrier 21 has an electrically insulating material 34. The electrically insulating material 34 of the carrier 21 extends over the entire lateral extent of the carrier 21.

The cavity 24 extends completely through the insulating layer 22 from a top side 27, which is turned away from the carrier 21, to the carrier 21. The semiconductor chip 25, which is arranged in the cavity 24, terminates flush with the insulating layer 22 in a vertical direction z, the vertical direction z being perpendicular to the main extension plane of the optoelectronic component 20.

In addition, the optoelectronic component 20 has a first contact layer 23, which is an electrically conductive material. The first contact layer 23 is located between the semiconductor chip 25 and the carrier 21 and between the insulating layer 22 and the carrier 21.

A second contact layer 31 is arranged on the underside 30 of the carrier 21 facing away from the insulating layer 22. The second contact layer 31 is made of an electrically conductive material. The second contact layer 31 covers the underside 30 of the carrier 21 in places.

The first contact layer 23 and the second contact layer 31 have at least one interruption 26, so that the carrier 21 is free of the first contact layer 23 and the second contact layer 31 at least in places in the area of the cavity 24. The first contact layer 23 and the second contact layer 31 thus have several areas which are spaced apart from each other. In the area of the cavity 24, the first contact layer 23 is located between the semiconductor chip 25 and the carrier 21. The semiconductor chip 25 is connected to the first contact layer 23 by an adhesive layer 33, which contains an adhesive. The first contact layer 23 is not necessarily flush with the semiconductor chip 25.

A third contact layer 32 is arranged in places on a top side 27 of the insulating layer 22 facing away from the carrier 21. The third contact layer 32 comprises an electrically conductive material. The third contact layer 32 comprises several areas which are spaced apart from each other. The third contact layer 32 comprises electrical connections 29.

Thus the optoelectronic component 20 is free of an electrically conductive layer which extends over the entire extent of the optoelectronic component 20 in a lateral direction x. When temperature changes occur, thermo-mechanical stresses arising in the area of interruption 26 of the first contact layer 23 and the second contact layer 31 can therefore be at least partially relieved from the carrier 21. Bending of the carrier 21 in the area of the semiconductor chip 25 is therefore avoided or reduced. This increases the stability of the connection between the semiconductor chip 25 and the carrier 21. Thus the lifetime of the optoelectronic component 20 can be increased and the optoelectronic component 20 can be operated efficiently.

Figure 3B:
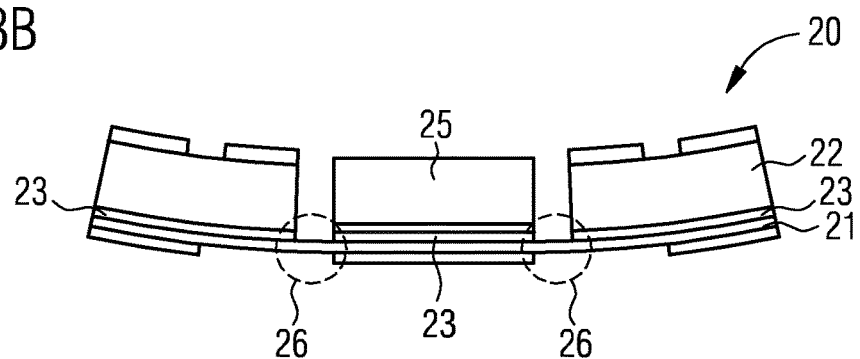

In FIG. 3B the exemplary embodiment of the optoelectronic component 20 from FIG. 3A is shown. It is shown that in this exemplary embodiment, bending of the optoelectronic component 20 can occur with temperature changes, wherein the bending in the area of the semiconductor chip 25 can be reduced or avoided because the first contact layer 23 and the second contact layer 31 have interruptions 26.

Figure 4A:
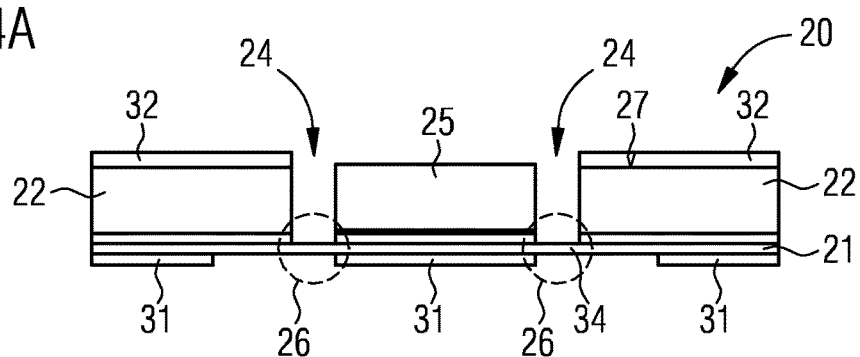

In FIG. 4A a schematic cross-section of the optoelectronic component 20 according to another exemplary embodiment is shown. In contrast to the exemplary embodiment shown in FIG. 3A, the third contact layer 32 completely covers the insulating layer 22 on its top side 27. It has been shown that with a third contact layer 32 which completely covers the top side 27 of the insulating layer 22, the bending of the optoelectronic component 20 in the area of the insulating layer 22 is reduced with temperature changes.

The third contact layer 32, which is for example arranged in a frame around the semiconductor chip 25, can counteract the bending of the insulating layer 22 during temperature changes, which results from the lower lateral thermal expansion of the insulating layer 22 compared to the first contact layer 23 and to the second contact layer 31.

Reduced bending of the optoelectronic component 20 during temperature changes can be advantageous if the component 20 is surface mounted on a circuit in an application using a soldering process.

Figure 4B:
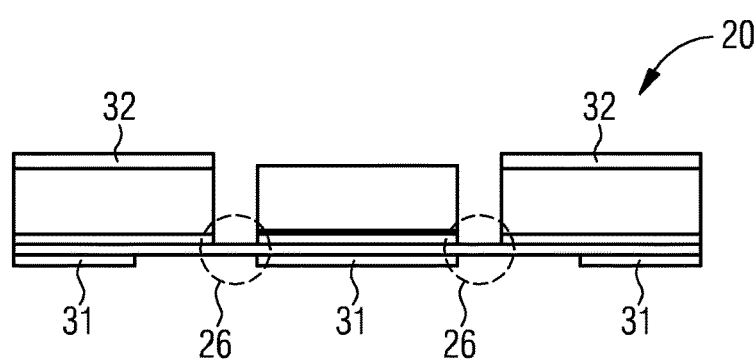

In FIG. 4B the exemplary embodiment of the optoelectronic component 20 shown in FIG. 4A is shown. It is shown that the bending of the optoelectronic component 20 is prevented or reduced when the temperature changes, both in the area of the cavity 24 as well as in the area of the insulating layer 22.

Figure 5:
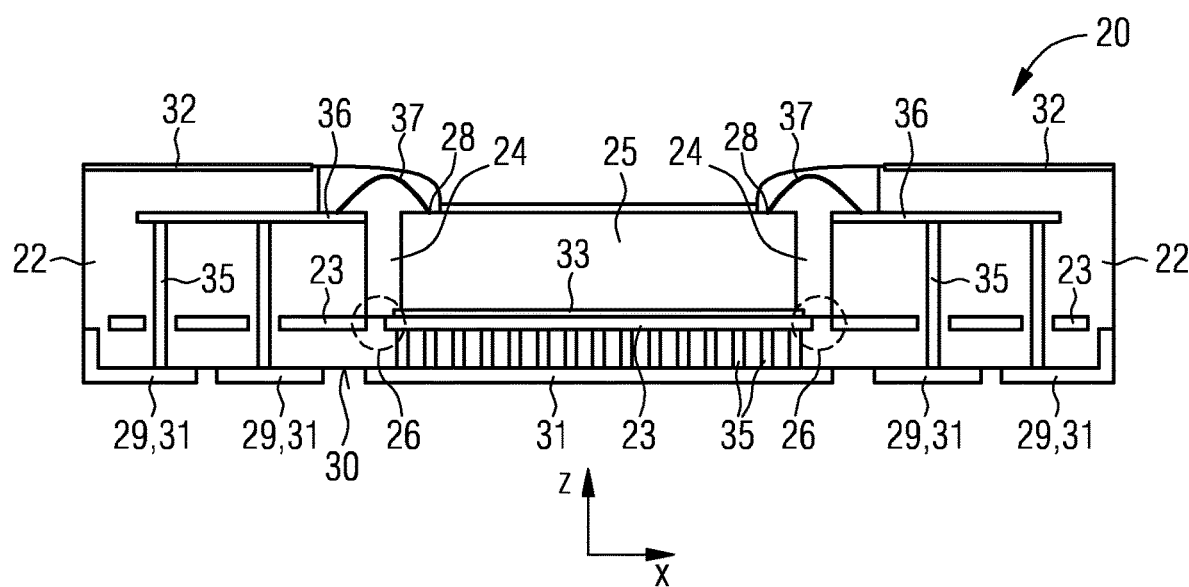

In FIG. 5 a schematic cross-section of the optoelectronic component 20 according to another exemplary embodiment is shown. The carrier 21 comprises a large number of vias 35 which extend from the first contact layer 23 through the carrier 21 to the second contact layer 31. The vias 35 extend in vertical direction z. The vias 35 are made of an electrically conductive material. Thus, the first contact layer 23 is electrically conductively connected to the second contact layer 31. Furthermore, the first contact layer 23 is thermally connected to the second contact layer 31. This enables heat to be dissipated from the semiconductor chip 25 via the first contact layer 23 to the second contact layer 31.

The semiconductor chip 25 has two electrical contacts 28 on a side facing away from the carrier 21. Each of the electrical contacts 28 is electrically connected via a bonding wire 37 in each case to a fourth contact layer 36. The fourth contact layer 36 is located in places on the insulating layer 22 and in places within the insulating layer 22.

The fourth contact layer 36 comprises an electrically conductive material and extends parallel to the main extension plane of the carrier 21. The fourth contact layer 36 is electrically conductively connected to the second contact layer 31 and the third contact layer 32 via vias 35.

The vias 35 extend in a vertical direction z from the fourth contact layer 36 to the second contact layer 31 on the underside 30 of the carrier 21 or to the third contact layer 32 on the top side 27 of the insulating layer 22. The vias 35 are spaced apart from the first contact layer 23.

Each of the vias 35 is electrically conductively connected to an electrical connection 29 of the second contact layer 31. Thus the electrical contacts 28 of the semiconductor chip 25 are electrically conductively connected to the electrical connections 29 on the underside 30 of the carrier 21. The optoelectronic component 20 is thus surface-mounted.

The first contact layer 23 has several interruptions 26. The first contact layer 23 has two interruptions 26 in the area of the cavity 24. In addition, the first contact layer 23 has 23 interruptions 26 in the area of the vias 35. The first contact layer 23 covers the carrier 21 in lateral directions x in places and not completely. For example, the first contact layer 23 may cover less than 90% of the lateral extent of the carrier 21.

Figure 6A:
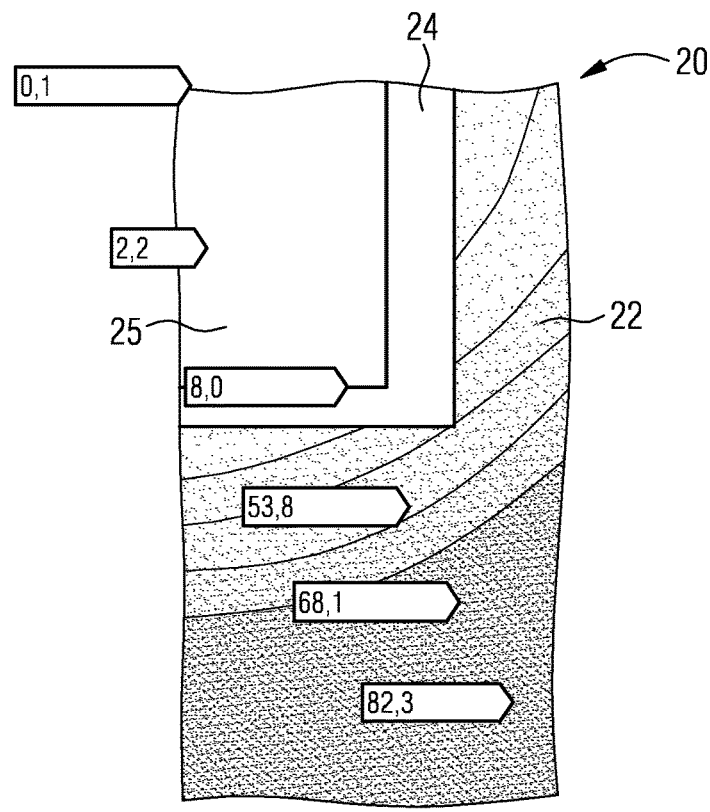

In FIG. 6A a top view of a section of an optoelectronic component 20, which is not an exemplary embodiment is shown. The section in FIG. 6A has the structure shown in FIG. 1A without the semiconductor chip 25 and corresponds to a quarter of the area of the optoelectronic component 20. The section shown is selected so that the edges of the section run along the two axes of symmetry of the optoelectronic component 20. Furthermore, finite element computer simulations of the vertical displacement of the surface of the optoelectronic component 20 at a temperature of 250° C. in μm relative to a temperature of 25° C. are shown. The vertical direction is perpendicular to a main extension plane of the optoelectronic component 20. The area where the semiconductor chip 25 would be located is outlined with dashed lines. In this area the vertical displacement is up to 82 μm.

Figure 6B:
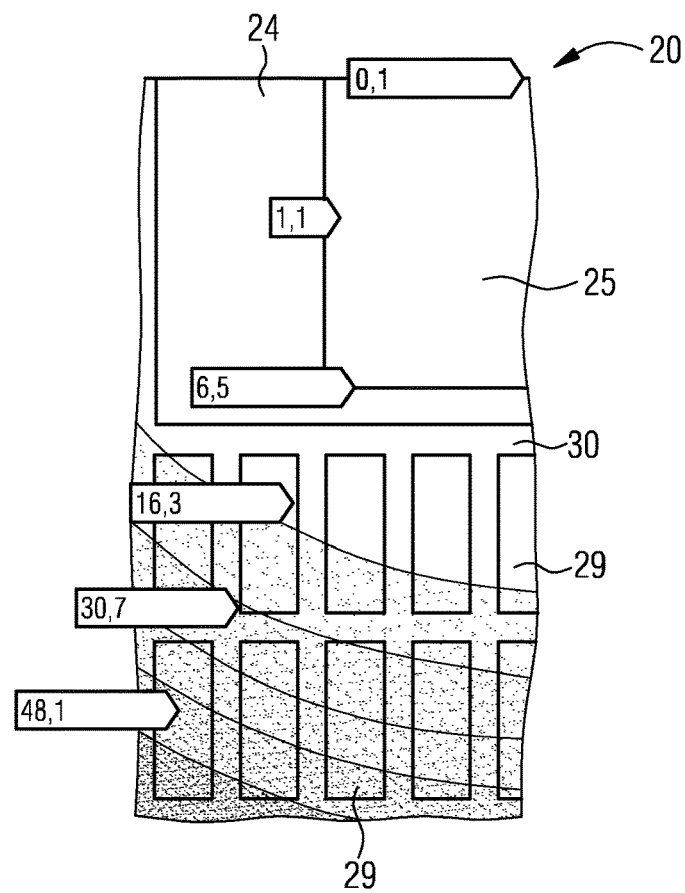

In FIG. 6B a top view from the underside 30 of the carrier 21 of the optoelectronic component 20 shown in FIG. 6A is shown. Several electrical connections 29 are located on the underside 30. On the underside 30, the vertical displacement in the area of the semiconductor chip 25 at 250° C. is up to 6.5 μm and on the edge of the optoelectronic component 20 up to 48 μm, relative to the state at 25°.

Figure 7A:
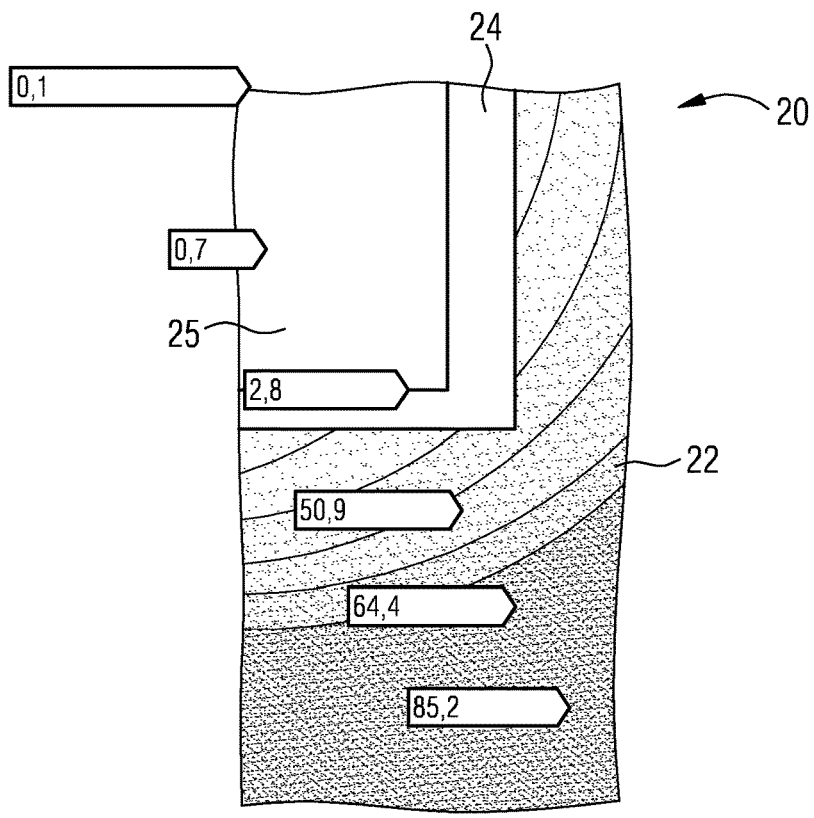

In FIG. 7A a top view of a section of the optoelectronic component 20 according to an exemplary embodiment is shown. The optoelectronic component 20 has the structure shown in FIG. 3A without the semiconductor chip 25. The section shown here corresponds to a quarter of the area of the optoelectronic component 20 in FIG. 3A and is selected so that the edges of the section run along the two axes of symmetry of the optoelectronic component 20. The computer simulations of the vertical displacement of the optoelectronic component 20 at 250° C. show that the surface of the optoelectronic component 20 in the area of the semiconductor chip 25 is displaced by a maximum of 2.8 μm relative to the state at 25° C. At the edge of the optoelectronic component 20, the vertical displacement is up to 85 μm. In contrast to the optoelectronic component 20 shown in FIG. 6A, the first contact layer 23 and the second contact layer 31 of the optoelectronic component 20 shown in FIG. 7A have at least one interruption 26. As a result, the bending of the component 20 in the area of the semiconductor chip 25 is significantly reduced when the temperature changes. The thermo-mechanical stresses that occur during temperature changes can be reduced via the carrier 21 due to the interruption 26 of the first contact layer 23 and the second contact layer 31.

Figure 7B:
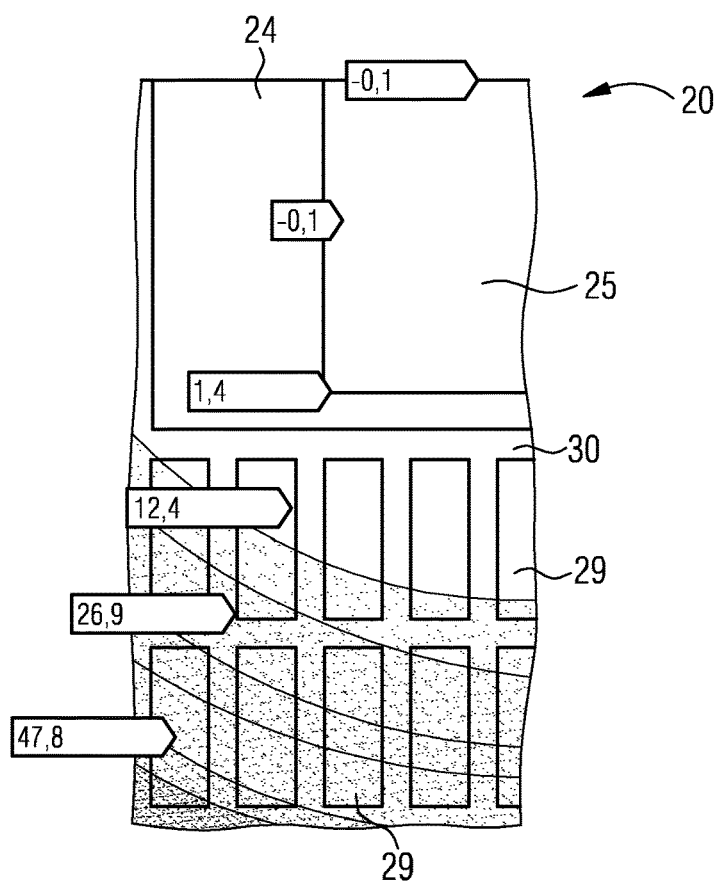

In FIG. 7B a top view from the underside 30 of the carrier 21 of the optoelectronic component 20 shown in FIG. 7A is shown. Several electrical connections 29 are located on the underside 30. On the underside 30, the vertical displacement of the component 20 at 250° C., as shown in the computer simulations, is at most 1 μm in the area of the semiconductor chip 25 and up to 48 μm at the edge of the optoelectronic component 20, relative to the state at 25° C. Here too, the bending of the component 20 in the area of the semiconductor chip 25 is significantly reduced when the temperature changes, for example in comparison with the example shown in FIG. 6B.

Figure 8A:
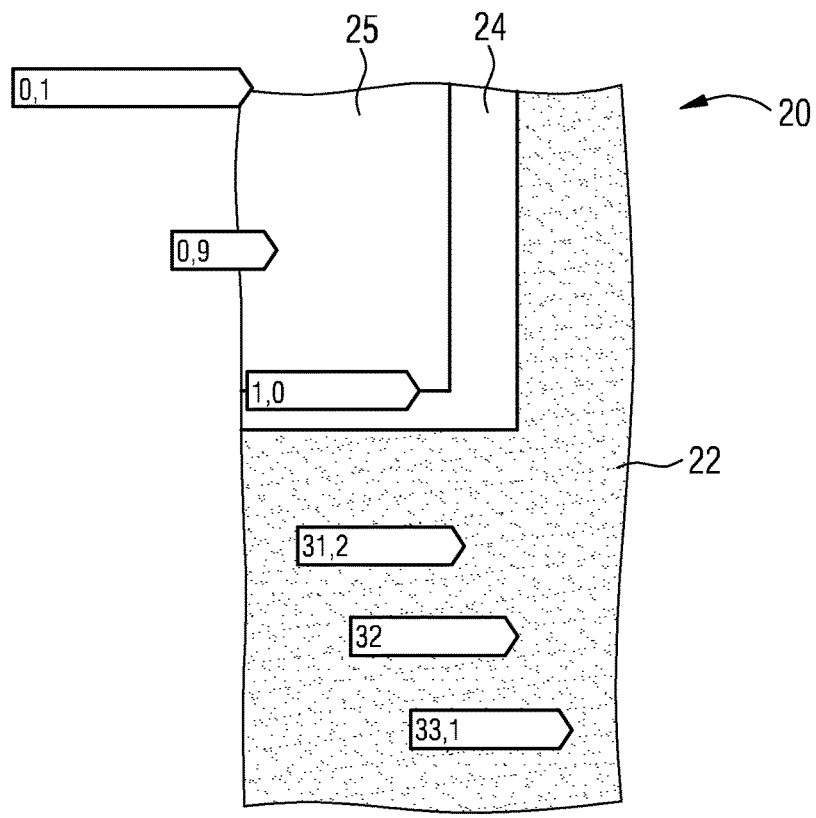

In FIG. 8A a top view of a section of the optoelectronic component 20 according to another exemplary embodiment is shown. The optoelectronic component 20 has the structure shown in FIG. 4A without the semiconductor chip 25. The section shown here corresponds to a quarter of the area of the optoelectronic component 20 in FIG. 4A and is selected so that the edges of the section run along the two axes of symmetry of the optoelectronic component 20. In this exemplary embodiment, the third contact layer 32 completely covers the top side 27 of the insulating layer 22. The computer simulations of the vertical displacement of the optoelectronic component 20 at 250° C. show that the surface of the optoelectronic component 20 in the area of the semiconductor chip 25 shifts by a maximum of 1 µm relative to the state at 25°. At the edge of the optoelectronic component 20, the vertical displacement is up to 33 µm.

This means that the vertical displacement of the surface of the optoelectronic component 20 over the entire extent of the optoelectronic component 20 during temperature changes is significantly reduced compared to the optoelectronic component 20 shown in FIG. 6A. The displacement at the edge of the optoelectronic component 20 is also significantly reduced compared to the optoelectronic component 20 shown in FIG. 7A. The third contact layer 32 on top of the insulating layer 22 counteracts the bending of the insulating layer 22, which results from the lower thermal lateral expansion of the insulating layer 22 compared to the first contact layer 23 and the second contact layer 31.

Figure 8B:
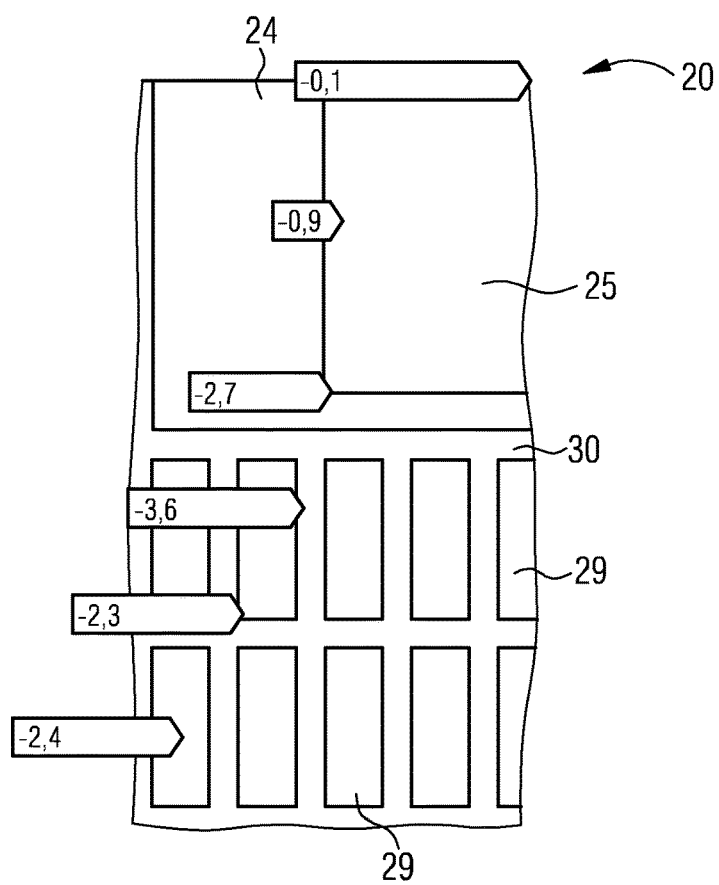

In FIG. 8B a top view from the underside 30 of the carrier 21 of the optoelectronic component 20 shown in FIG. 8A is shown. Several electrical connections 29 are located on the underside 30. On the underside 30, the vertical displacement in the area of the semiconductor chip 25 is up to 2.7 µm and on the edge of the optoelectronic component 20 is up to 2.4 µm in the opposite direction compared to FIG. 7B. Here again, the vertical displacement at the edge of the optoelectronic component 20 is significantly reduced when the temperature changes, especially compared to the examples in FIGS. 6B and 7B.

Figure 9A:
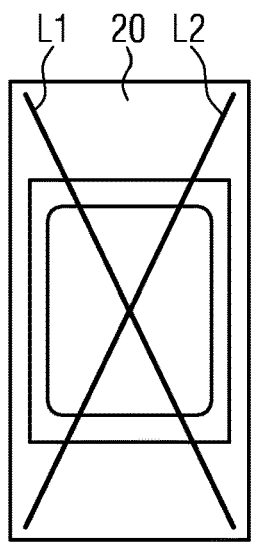

FIG. 9A shows a top view of an optoelectronic component 20, which is not an exemplary embodiment. The optoelectronic component 20 has the structure shown in FIG. 1A without the semiconductor chip 25. Two lines L1, L2 extending across the optoelectronic component 20 show along which lines L1, L2 the vertical displacement of the surface of the optoelectronic component 20 was measured at different temperatures relative to 25° C.

Figure 9B:
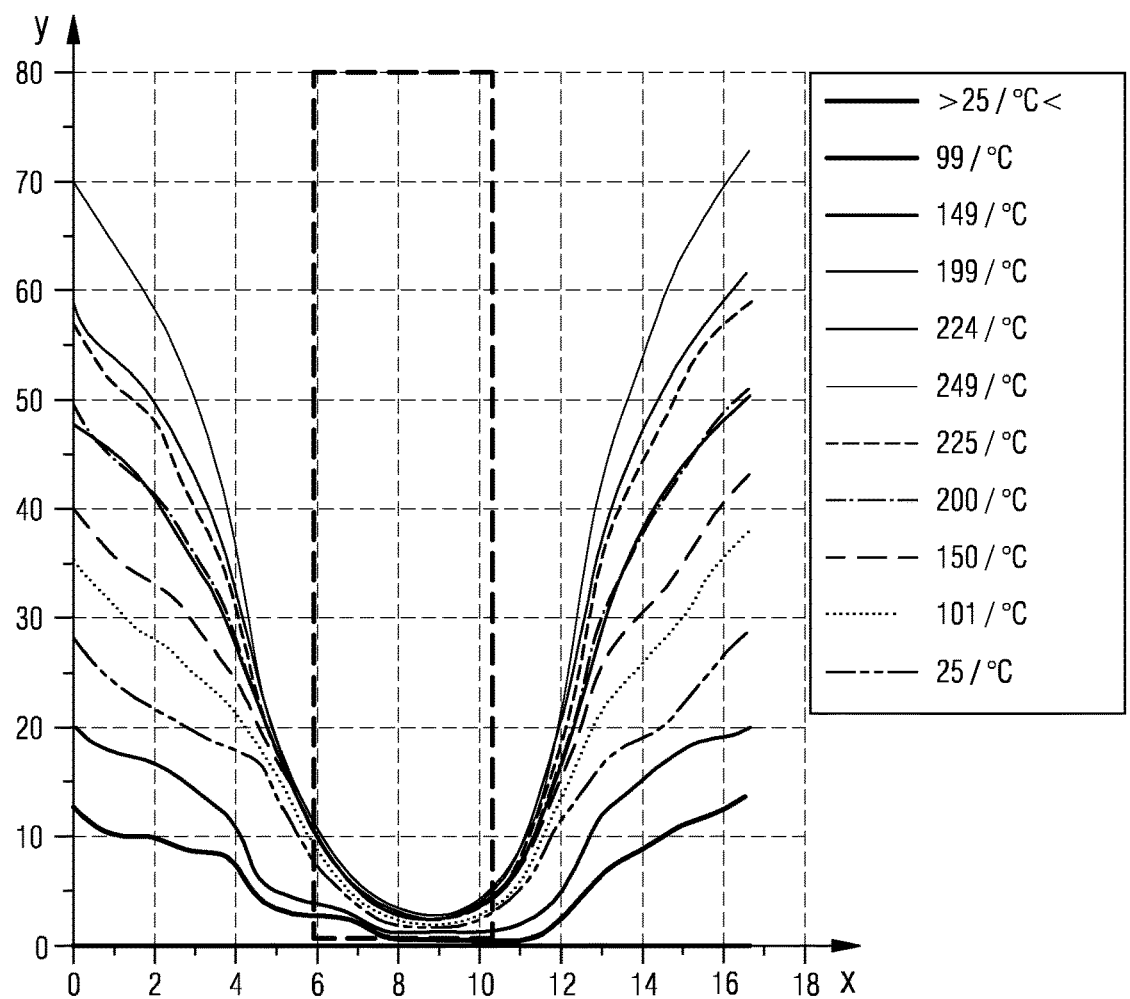

FIG. 9B shows the measured values of the vertical displacement of the surface of the optoelectronic component 20 shown in FIG. 9A. On the x-axis the position along the line L2 shown in FIG. 9A is plotted in mm. On the y-axis the vertical displacement is plotted in µm. The vertical displacement of the surface of the optoelectronic component 20 has been measured for different temperatures. The range between 6 mm and 11 mm, marked with a dotted line, is the range in which the semiconductor chip 25 would be located. The vertical displacement of the surface of the optoelectronic component 20 at 249° C. is up to 9 µm in this area and up to 70 µm at the edge of the optoelectronic component 20.

Figure 10A:
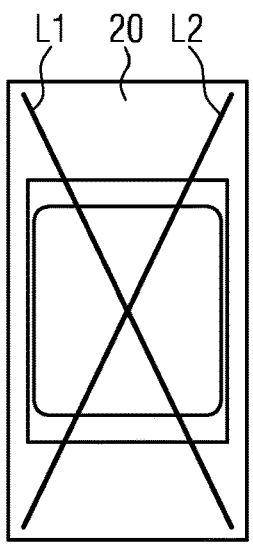

FIG. 10A shows a top view of the optoelectronic component 20 according to an exemplary embodiment. The optoelectronic component 20 has the structure shown in FIG. 4A without the semiconductor chip 25. The two lines L1, L2 extending across the optoelectronic component 20 show along which lines L1, L2 the vertical displacement of the surface of the optoelectronic component 20 was measured at different temperatures.

Figure 10B:
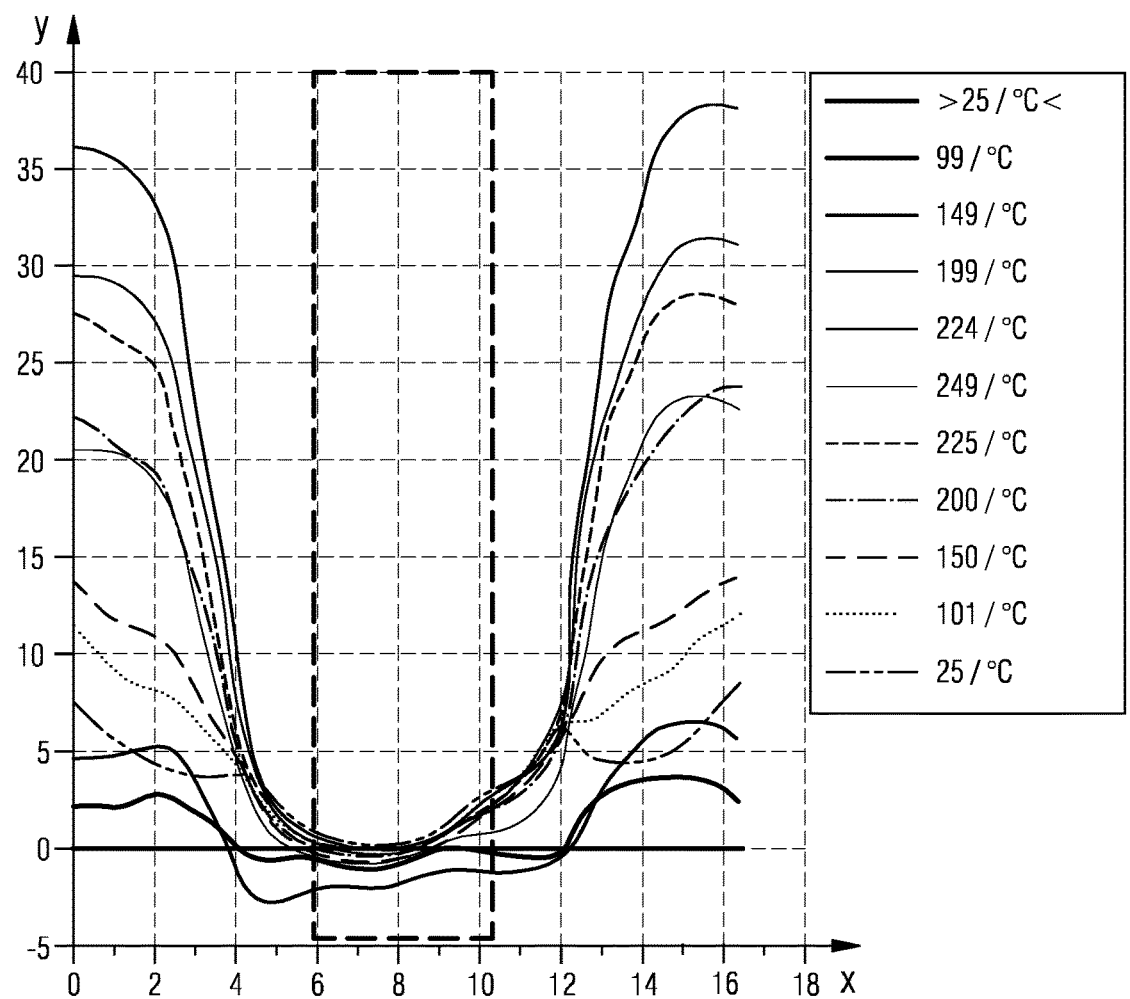

FIG. 10B shows the measured values of the vertical displacement of the surface of the optoelectronic component 20 shown in FIG. 10A. On the x-axis the position along the line L2 shown in FIG. 10A is plotted in mm. On the y-axis the vertical displacement is plotted in µm. The vertical displacement of the surface of the optoelectronic component 20 has been measured for different temperatures. The range between 6 mm and 11 mm, marked with a dotted line, is the range in which the semiconductor chip 25 would be located. The vertical displacement of the surface of the optoelectronic component 20 at 249° C. is up to 2 µm in this area and up to 37 µm at the edge of the optoelectronic component 20. Thus, the measurements also show that the vertical displacement of the surface of the optoelectronic component 20 according to the exemplary embodiment shown in FIG. 4A is significantly reduced compared to the optoelectronic component 20 shown in FIG. 1A.

The invention is not limited to these by the description based on the exemplary embodiments. Rather, the invention comprises any new feature as well as any combination of features, which includes in particular any combination of features in the patent claims, even if that feature or this combination itself is not explicitly stated in the patent claims or exemplary embodiments.

The present patent application claims the priority of the German patent application DE 10 2018 111 791.4, the disclosure content of which is hereby incorporated by reference.

LIST OF REFERENCE SIGNS

20: optoelectronic component
21: carrier
22: insulating layer
23: first contact layer
24: cavity
25: optoelectronic semiconductor chip
26: interruption
27: top side
28: electrical contact
29: electrical connection
30: underside
31: second contact layer
32: third contact layer
33: adhesive layer
34: electrically insulating material
35: vias
36: fourth contact layer
37: bonding wire
L1, L2: line
x: lateral direction
z: vertical direction

The invention claimed is:
1. An optoelectronic component, comprising:
a carrier,
an optoelectronic semiconductor chip,
an insulating layer which has an electrically insulating material, and
a first contact layer which has an electrically conductive material,
wherein
the insulating layer is arranged on the carrier and has a cavity,
the optoelectronic semiconductor chip is arranged in the cavity,
the first contact layer is arranged between the optoelectronic semiconductor chip and the carrier and between the insulating layer and the carrier,
the first contact layer has at least one interruption, such that the carrier is free of the first contact layer at least in places in a region of the cavity, in which a third contact layer, which has an electrically conductive material, is arranged at least in places on a top side of the insulating layer facing away from the carrier,
the cavity has side walls which are perpendicular to a main extension plane of the carrier,
the cavity extends completely through the insulating layer from a top side facing away from the carrier to the carrier, a second contact layer, which has an electrically conductive material, is arranged at least in places on an underside of the carrier facing away from the insulating layer and has at least one interruption, so that the carrier is free of the second contact layer at least in places in the region of the cavity, the carrier comprises at least one area in the region of the cavity which is free of the first contact layer, the second contact layer and the optoelectronic semiconductor chip, the carrier is free of the second contact layer on the underside of the carrier facing away from the insulating layer in the at least one area, a fourth contact layer electrically connected to the second contact layer through at least one via in the insulating layer; and the optoelectronic semiconductor chip is protruded over by the insulating layer in a vertical direction or ends flush therewith, wherein the vertical direction is perpendicular to a main extension plane of the optoelectronic component.

2. The optoelectronic component according to claim 1, in which the optoelectronic semiconductor chip and the insulating layer are arranged without contact to each other.

3. The optoelectronic component according to claim 1, in which the first contact layer is electrically conductively connected to the second contact layer.

4. The optoelectronic component according to claim 1, in which the optoelectronic semiconductor chip has electrical contacts on a side facing away from the carrier.

5. The optoelectronic component according to claim 4, in which the electrical contacts of the optoelectronic semiconductor chip are electrically conductively connected to electrical connections on the underside of the carrier facing away from the insulating layer.

6. The optoelectronic component according to claim 1, which is surface mountable.

7. The optoelectronic component according to claim 1, which is free of an electrically conductive layer extending over an entire extent of the optoelectronic component in a lateral direction, wherein the lateral direction being parallel to the main extension plane of the optoelectronic component.

8. The optoelectronic component of claim 1, wherein the top side of the insulating layer is at least partially free of the third contact layer.

9. An optoelectronic component, comprising:
a carrier,
an optoelectronic semiconductor chip,
an insulating layer which has an electrically insulating material, and
a first contact layer which has an electrically conductive material,
wherein
the insulating layer is arranged on the carrier and has a cavity,
the optoelectronic semiconductor chip is arranged in the cavity,
the first contact layer is arranged between the optoelectronic semiconductor chip and the carrier and between the insulating layer and the carrier,
the first contact layer has at least one interruption, such that the carrier is free of the first contact layer at least in places in a region of the cavity, in which a third contact layer, which has an electrically conductive material, is arranged at least in places on a top side of the insulating layer facing away from the carrier, the cavity has side walls which are perpendicular to a main extension plane of the carrier from the top side of the insulating layer to the carrier, the cavity extends completely through the insulating layer from a top side facing away from the carrier to the carrier, a second contact layer, which has an electrically conductive material, is arranged at least in places on an underside of the carrier facing away from the insulating layer and has at least one interruption, so that the carrier is free of the second contact layer at least in places in the region of the cavity, the third contact layer is not located in the region of the cavity, and a fourth contact layer electrically connected to the second contact layer through at least one via in the insulating layer, in which the optoelectronic semiconductor chip is protruded over by the insulating layer in a vertical direction or ends flush therewith, wherein the vertical direction is perpendicular to a main extension plane of the optoelectronic component.

10. The optoelectronic component according to claim 9, wherein the optoelectronic component is free of an electrically conductive layer extending over an entire extent of the optoelectronic component in a lateral direction, the lateral direction being parallel to the main extension plane of the optoelectronic component.

11. An optoelectronic component, comprising:
a carrier,
an optoelectronic semiconductor chip,
an insulating layer which has an electrically insulating material, and
a first contact layer which has an electrically conductive material,
wherein
the insulating layer is arranged on the carrier and has a cavity,
the optoelectronic semiconductor chip is arranged in the cavity,
the first contact layer is arranged between the optoelectronic semiconductor chip and the carrier and between the insulating layer and the carrier,
the first contact layer has at least one interruption, such that the carrier is free of the first contact layer at least in places in a region of the cavity, in which a third contact layer, which has an electrically conductive material, is arranged at least in places on a top side of the insulating layer facing away from the carrier,
the optoelectronic semiconductor chip is flush with the insulating layer in a vertical direction, wherein the vertical direction being perpendicular to a main extension plane of the optoelectronic component,
a fourth contact layer electrically connected to a second contact layer through at least one via in the insulating layer, and
in which the third contact layer completely covers the top side of the insulating layer.

12. The optoelectronic component according to claim 11, in which a second contact layer, which has an electrically conductive material, is arranged at least in places on an underside of the carrier facing away from the insulating layer and has at least one interruption, so that the carrier is free of the second contact layer at least in places in the region of the cavity.

13. The optoelectronic component according to claim 11, in which the first contact layer has two interruptions in an area of the cavity.

* * * * *